United States Patent
Chiang

(10) Patent No.: US 9,968,152 B2
(45) Date of Patent: May 15, 2018

(54) COMBINATION KNITTED HAT AND EARPHONE ASSEMBLY

(71) Applicant: SOUND TEAM ENTERPRISE CO., LTD., Taipei (TW)

(72) Inventor: Tsung-Pai Chiang, Taoyuan (TW)

(73) Assignee: SOUND TEAM ENTERPRISE CO., LTD., Taipei (TW)

( * ) Notice: Subject to any disclaimer, the term of this patent is extended or adjusted under 35 U.S.C. 154(b) by 0 days. days.

(21) Appl. No.: 15/226,140

(22) Filed: Aug. 2, 2016

(65) Prior Publication Data

US 2017/0042270 A1    Feb. 16, 2017

(30) Foreign Application Priority Data

Aug. 14, 2015  (TW) .............................. 104213173 U
Jan. 14, 2016  (TW) .............................. 105200523 U

(51) Int. Cl.
| | |
|---|---|
| *A42B 1/24* | (2006.01) |
| *G11C 5/06* | (2006.01) |
| *A42B 1/04* | (2006.01) |
| *H04R 1/02* | (2006.01) |
| *H03G 3/04* | (2006.01) |
| *H04R 1/10* | (2006.01) |

(52) U.S. Cl.
CPC .............. *A42B 1/245* (2013.01); *A42B 1/041* (2013.01); *A42B 1/241* (2013.01); *H03G 3/04* (2013.01); *H04R 1/025* (2013.01); *H04R 1/1008* (2013.01); *H04R 1/1033* (2013.01); *H04R 1/1041* (2013.01); *H04R 2201/023* (2013.01)

(58) Field of Classification Search
CPC .......... A42B 1/041; A42B 1/241; H03G 3/04; H04R 1/025; H04R 1/1008; H04R 1/1033
USPC ........................................................ 2/209.13
See application file for complete search history.

(56) References Cited

U.S. PATENT DOCUMENTS

| | | | | |
|---|---|---|---|---|
| 3,898,699 | A * | 8/1975 | Zientara ................... | A42C 1/02 2/175.1 |
| 4,165,542 | A * | 8/1979 | McLaughlin .......... | A42B 1/241 2/175.1 |
| 4,776,044 | A * | 10/1988 | Makins .................. | A42B 1/245 2/172 |

(Continued)

*Primary Examiner* — Khaled Annis
*Assistant Examiner* — Timothy K Trieu
(74) *Attorney, Agent, or Firm* — Muncy, Geissler, Olds & Lowe, P.C.

(57) ABSTRACT

Combination knitted hat and earphone assembly includes knitted hat including double-knitted bucket portion of elastic fabric defining therein head-receiving space for putting onto the user's head, brim portion extended from the bucket portion around the head-receiving space of the knitted hat and two storage pockets disposed inside the double-knitted bucket portion and respectively defined therein storage chamber and opening, and earphone set including two earphone speakers respectively inserted through the openings into the storage chambers of the storage pockets and two transmission wires extended from the earphone speakers and terminating in respective electrical signal input end for connection to control device that is mounted in the folded brim portion outside the double-knitted bucket portion, or external mobile electronic device being carried by the user. Thus, the user can use the earphone set to listen to music when the knitted hat is put on the head to keep the head warm.

16 Claims, 17 Drawing Sheets

(56) References Cited

U.S. PATENT DOCUMENTS

| | | | | |
|---|---|---|---|---|
| 5,881,390 A * | 3/1999 | Young | ............... | A41D 20/00 |
| | | | | 2/209.13 |
| 7,974,432 B1 * | 7/2011 | Ryan | ............... | A42B 1/245 |
| | | | | 2/195.1 |
| 8,111,859 B2 * | 2/2012 | Phillips | ............... | H04R 5/0335 |
| | | | | 381/374 |
| 9,118,996 B1 * | 8/2015 | Garcia | ............... | H04R 1/028 |
| 9,237,395 B2 * | 1/2016 | Sze | ............... | H04R 1/1033 |
| 2005/0123151 A1 * | 6/2005 | Whipple | ............... | A42B 1/245 |
| | | | | 381/103 |
| 2006/0185062 A1 * | 8/2006 | Peng | ............... | H04R 5/0335 |
| | | | | 2/209.13 |
| 2007/0171628 A1 * | 7/2007 | Seade | ............... | A42B 1/245 |
| | | | | 362/106 |
| 2008/0312935 A1 * | 12/2008 | Mau, II | ............... | G10L 15/26 |
| | | | | 704/275 |

\* cited by examiner

COMBINATION KNITTED HAT AND EARPHONE ASSEMBLY

This application claims the priority benefit of Taiwan patent application numbers 104213173 and 105200523, respectively filed on Aug. 14, 2015 and Jan. 14, 2016.

BACKGROUND OF THE INVENTION

1. Field of the Invention

The present invention relates to an earphone set-attached knitted hat and more particularly, to a combination knitted hat and earphone assembly, which comprises a knitted hat providing two storage pockets located at the brim portion thereof corresponding to the user's ears, and an earphone set having two earphone speakers thereof respectively accommodated in the storage pockets of the knitted hat and two transmission wires for connection to an external mobile sound source for audio input, and thus, the user can keep the head warm while listening to music.

2. Description of the Related Art

Following fast development of electronic technology, it is the market design concept to create electric and electronic devices having light, thin, short and small characteristics. Thus, smart phones, tablet computers, mini notebooks, ultra-books and many other small mobile electronic devices that are convenient to carry and use have been created to serve people. For the advantages of communication, dialogue, camera, video camera, internet, game, on-line game, navigation, music play and/or many other functions, these mobile electronic devices have become a requisite in many people's daily life.

Through a mobile electronic device, a user can download music from the internet for direct play. However, direct outputting a music song from the speaker of a mobile electronic device will interfere with surrounding people, and the user may be unable to hear the music song well. Therefore, people usually attach an earphone set to the ears to listen to music from a mobile music player or any other mobile electronic device. When one is resting, walking, riding a bicycle or motorcycle, or waiting for a bus, one may listen to a music outputted from a mobile music player by means of earphones, earbud headphones, in-ear headphones or over-the-ear headphones. Further, people may wear a knitted hat in winter or in a cold area. However, wearing earphones or any type of headphones outdoor may interfere with the wear of a knitted hat. After wearing a knitted hat to keep the head warm, it will be difficult or unstable to put an earphone set or headphone set on the ears.

The earphone set/headphone set or the knitted hat occupies a certain space around the user's head, the knitted hat or earphone set/headphone set may fall from the head when they both are put together on the head, and the user can simply select the knitted hat or the earphone set/headphone set for putting on the head. The earphone set/headphone set and the knitted hat are two separated items. Carrying these two items require much storage space. Further, the transmission wires of the earphone set/headphone set can be tangled, and the speakers can be damaged accidentally by an impact. If the transmission wires of the earphone set/headphone set are tangled, the user needs to untangle the tangled transmission wires. Further, when the user wears the earphone set/headphone set and connects the transmission wires of the earphone set/headphone set to an electronic audio source, the transmission wires are suspended around the user's body and can easily be stretched when the user waves the hands or is walking, pulling the earphone set/headphone set away from the user's ears or causing component part damage.

Therefore, it is desirable to find a measure that allows people to wear an earphone set, a hat and a knitted hat conveniently and comfortably at the same time without causing any interference.

SUMMARY OF THE INVENTION

The present invention has been accomplished under the circumstances in view. It is therefore the main object of the present invention to provide a combination knitted hat and earphone assembly, which allows the user to wear an earphone set and a knitted hat conveniently and comfortably so that the user can keep the head warm while listening to music.

To achieve this and other objects of the present invention, a combination knitted hat and earphone assembly comprises a knitted hat and an earphone set. The knitted hat comprises a bucket portion of double-knitted fabric defining therein a head-receiving space for enabling the knitted hat to be positioned on the user's head, at least one brim portion extending from the bucket portion, and two storage pockets bilaterally located at the bucket portion adjacent to the at least one brim portion. Each storage pocket defines a storage chamber, and an opening in communication between the storage chamber and the space outside the respective storage pocket. The earphone set is mountable in the bucket portion of the knitted hat, comprising two earphone speakers respectively inserted through the openings of the storage pockets into the respective storage chambers, and two transmission wires each having one end thereof respectively electrically connected to the respective earphone speaker and an end thereof respectively terminating in a respective electrical signal input end for electrically connecting to a control device or an external mobile electronic device. Thus, the user can wear the knitted hat to keep the head warm and to listen to music.

According to another aspect of the present invention, the knitted hat further comprises a binding cover located at the bucket portion near the storage pockets and adapted for accommodating the control device in the knitted hat. After accommodation of the two earphone speakers of the earphone set in the storage chambers inside the storage pockets at the bucket portion of the knitted hat and after the knitted hat is put on the user's head, the two earphone speakers are respectively kept attached to the ears of the user subject to the elastic force of the double-knitted fabric of the bucket portion of the knitted hat, and the control device that is electrically connected with the electrical signal input ends of the transmission wires of the earphone set is held in the knitted hat by the binding cover at a front side of the user's head near one ear. Thus, the user can conveniently operate the control device to play music for output through the two earphone speakers toward the ear canals of the user's ears. At this time, the two transmission wires of the earphone set are kept in the folded at least one brim portion of the knitted hat, and thus, the transmission wires will neither be accidentally pulled up by an external object nor hinder user actions. Further, the control device can have music files stored therein, or be linked to a mobile electronic device by a cable or a wireless module (Bluetooth or Wi-Fi module) for audio input from the mobile electronic device. The mobile electronic device can be a mini radio, notebook computer, tablet computer, or smart phone.

In one embodiment of the present invention, the electrical signal input ends of the transmission wires of the earphone set are electrically connected to a control device linkable to a mobile electronic device by a wireless manner. In another embodiment of the present invention, the electrical signal input ends of the transmission wires of the earphone set are electrically connected to an audio connector for connection to a mini radio, notebook computer, tablet computer, smart phone or any other mobile electronic device by a signal line for audio input.

In one embodiment of the present invention, the combination knitted hat and earphone assembly comprises a knitted hat and an earphone set. The knitted hat comprises a double-knitted bucket portion of double-knitted fabric defining therein a head-receiving space for enabling the knitted hat to be positioned on the user's head, a brim portion extending from the bucket part, two storage pockets bilaterally located inside the bucket portion adjacent to the brim portion and respectively defining a storage chamber therein and an opening at an inner side thereof in communication with the storage chamber and the head-receiving space. The two earphone speakers of the earphone set are respectively inserted through the openings of the storage pockets into the storage chambers in the respective storage pockets to keep the transmission wires of the earphone set inside the folded brim portion of the knitted hat around the double-knitted bucket portion, allowing the electrical signal input ends of the two transmission wires to be respectively and electrically connected to a control device or a mobile electronic device, and thus, the user can listen to the music outputted through the earphone speakers while the knitted hat is put on the head of the user to keep the user's head warm.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
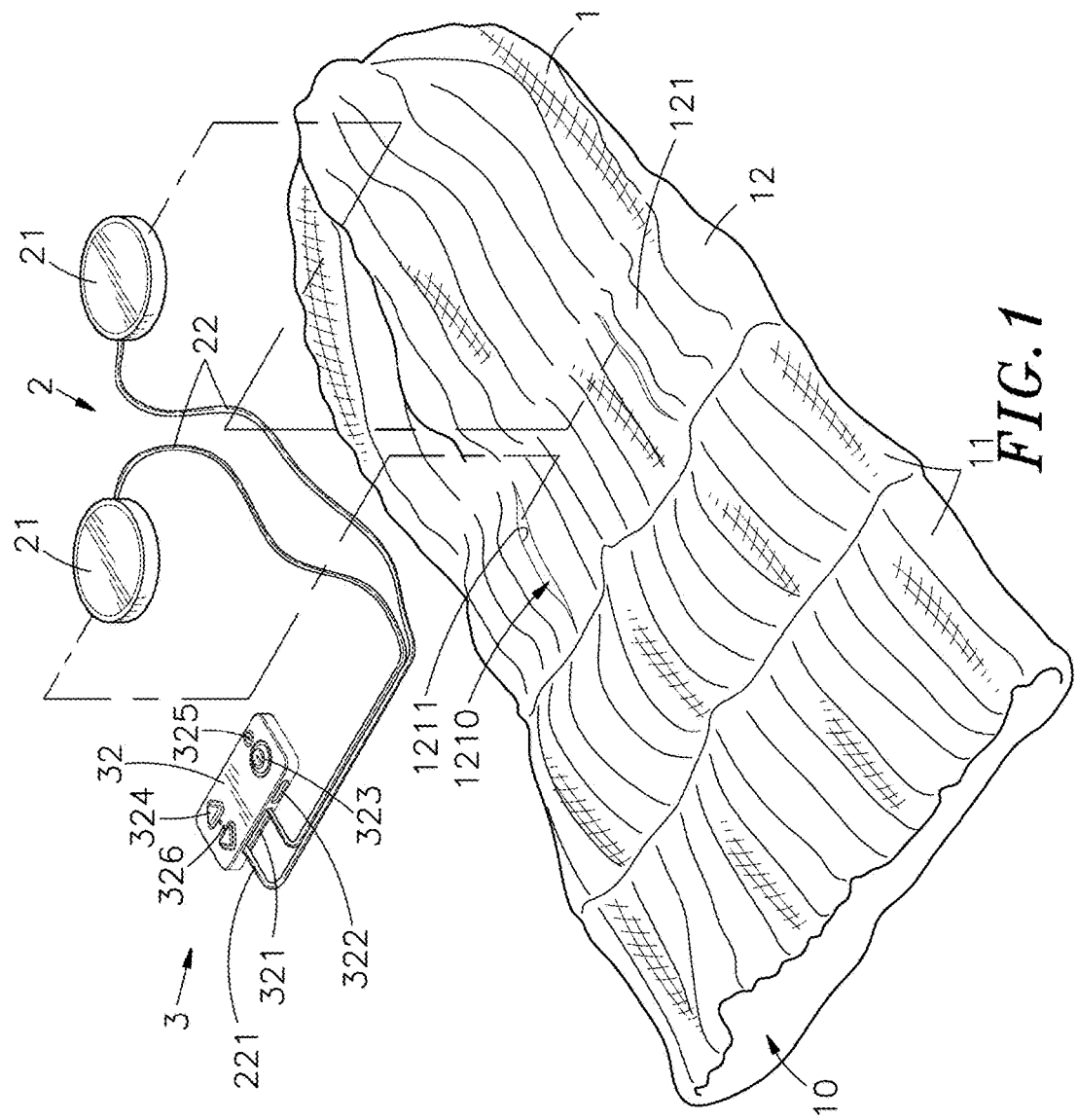
FIG. 1 is a schematic exploded view of a combination knitted hat and earphone assembly in accordance with the present invention.
Figure 2:
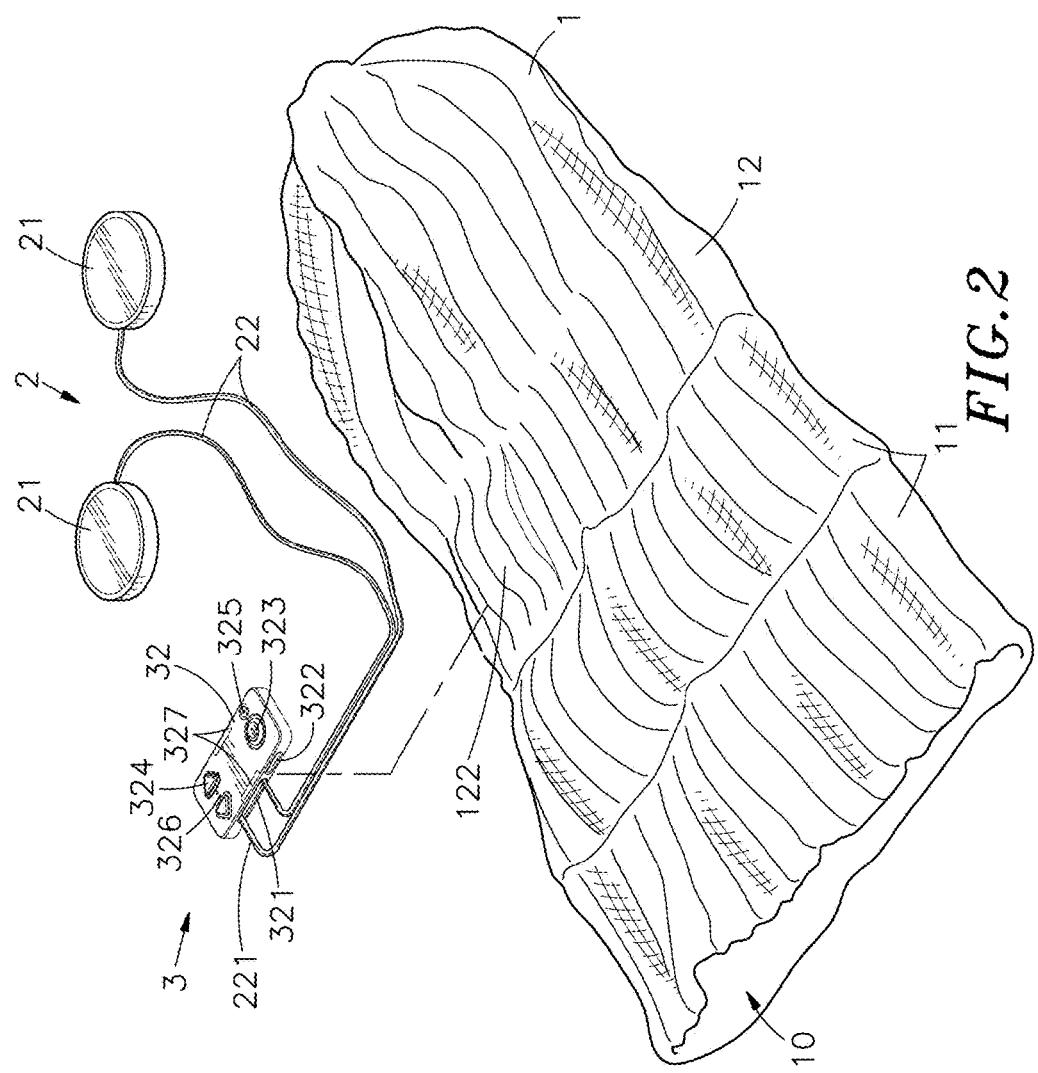
FIG. 2 corresponds to FIG. 1 when viewed from another angle.
Figure 3:
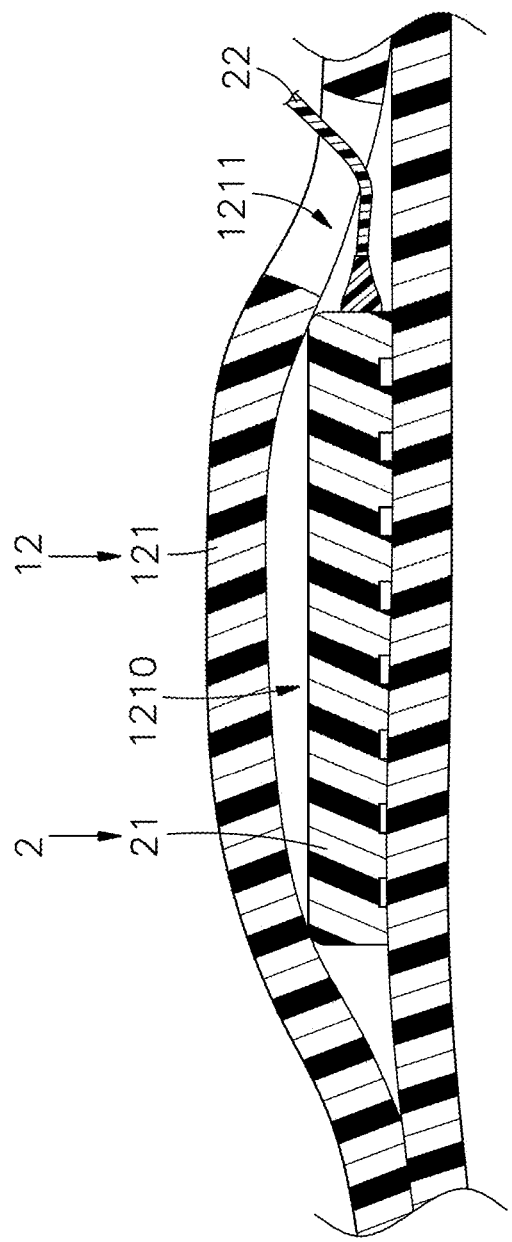
FIG. 3 is a sectional side view of one storage pocket of the knitted hat of the combination knitted hat and earphone assembly in accordance with the present invention.
Figure 4:
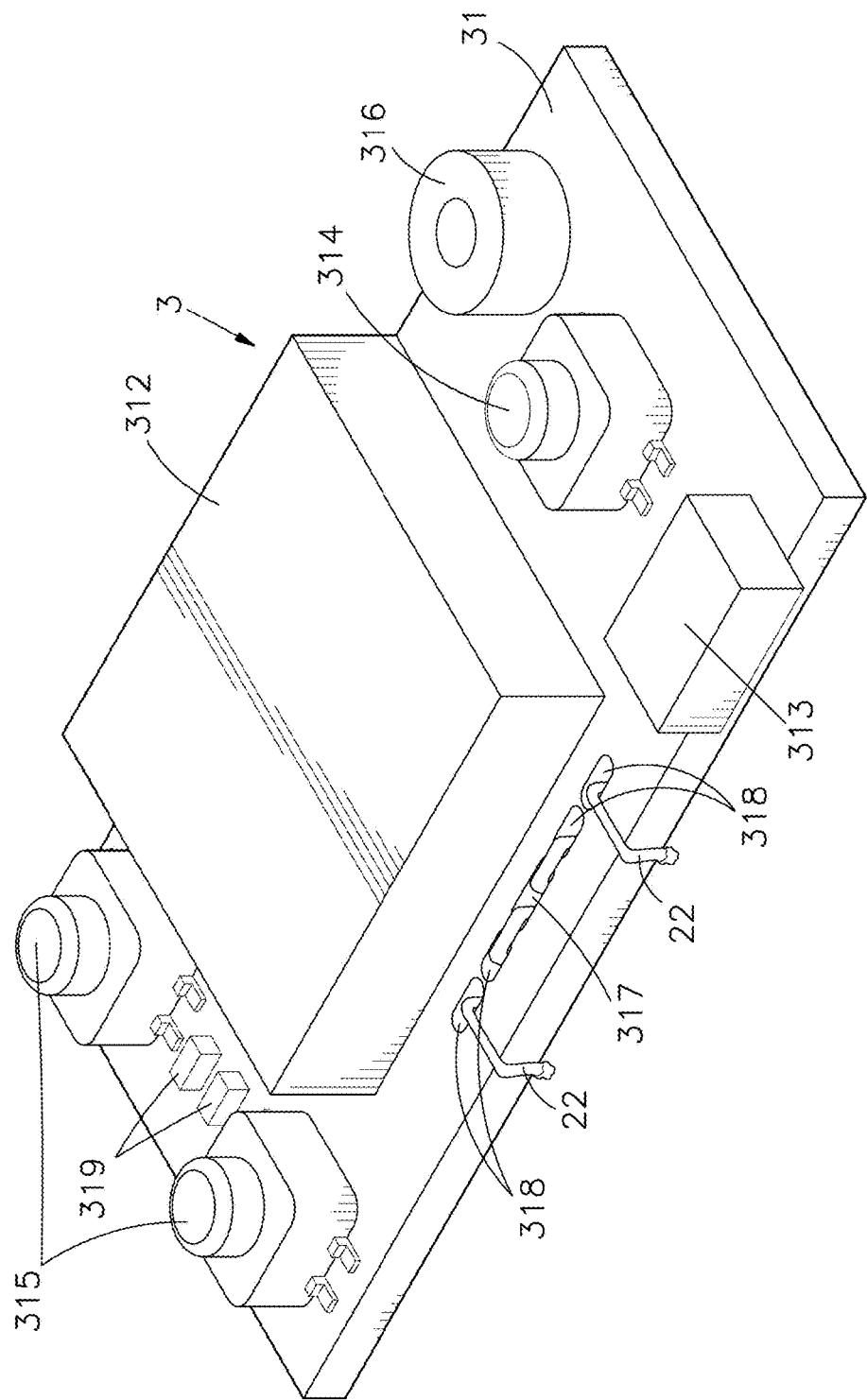
FIG. 4 is an oblique top elevational view of the circuit board assembly of the control device of the combination knitted hat and earphone assembly in accordance with the present invention.
Figure 5:
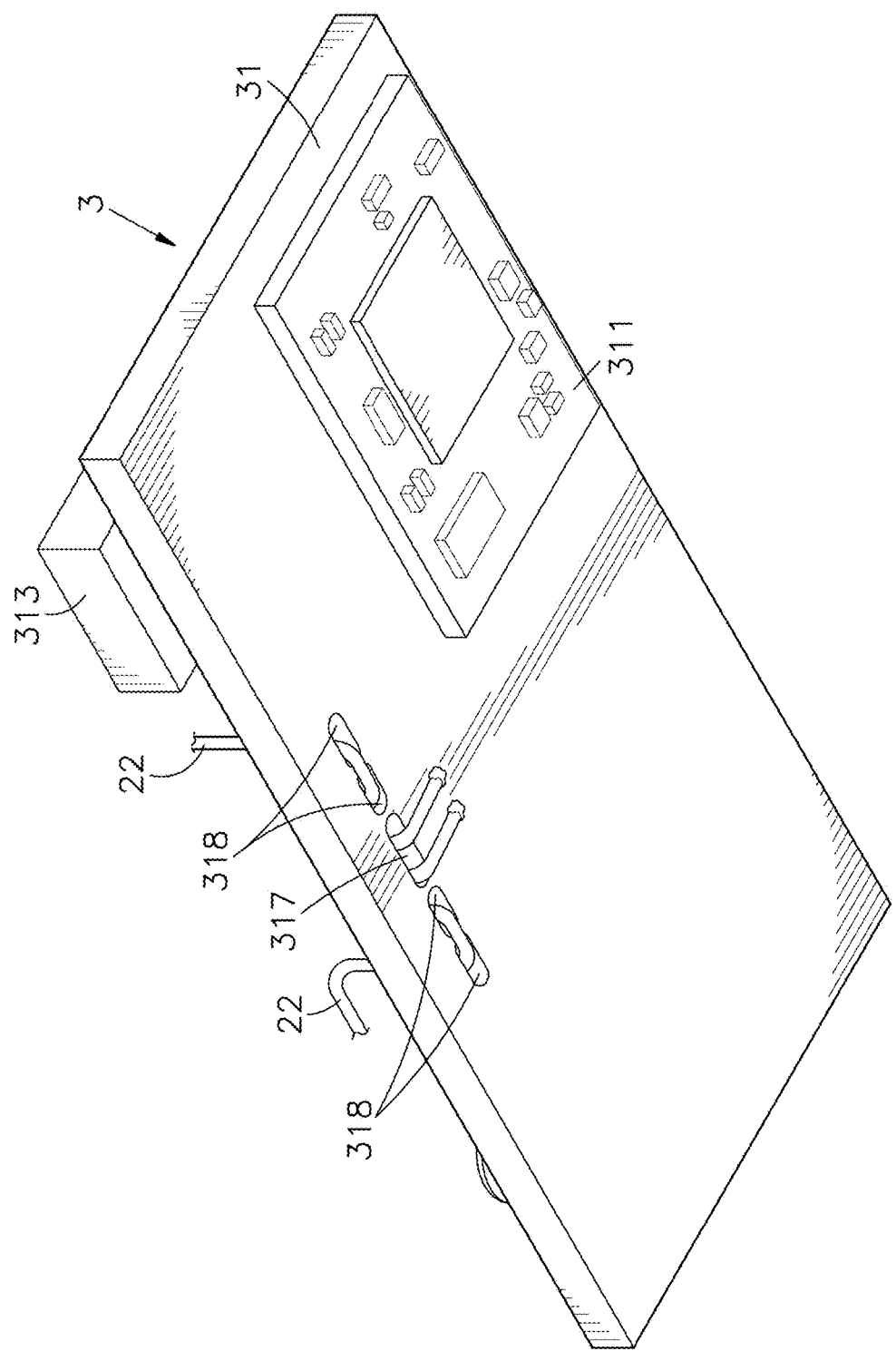
FIG. 5 is an oblique bottom elevational view of the circuit board assembly of the control device of the combination knitted hat and earphone assembly in accordance with the present invention.
Figure 6:
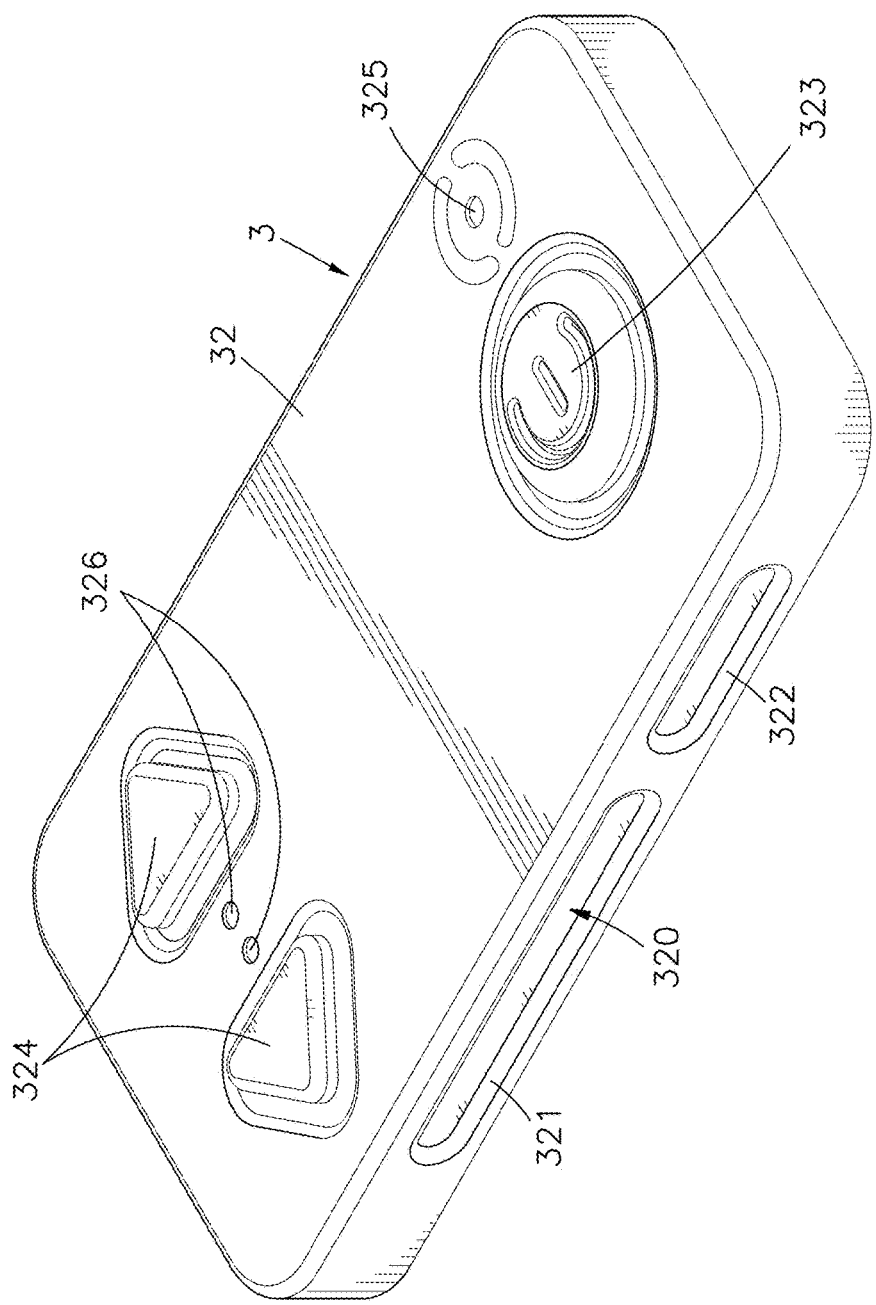
FIG. 6 is an oblique top elevational view of the elastic housing of the control device of the combination knitted hat and earphone assembly in accordance with the present invention.
Figure 7:
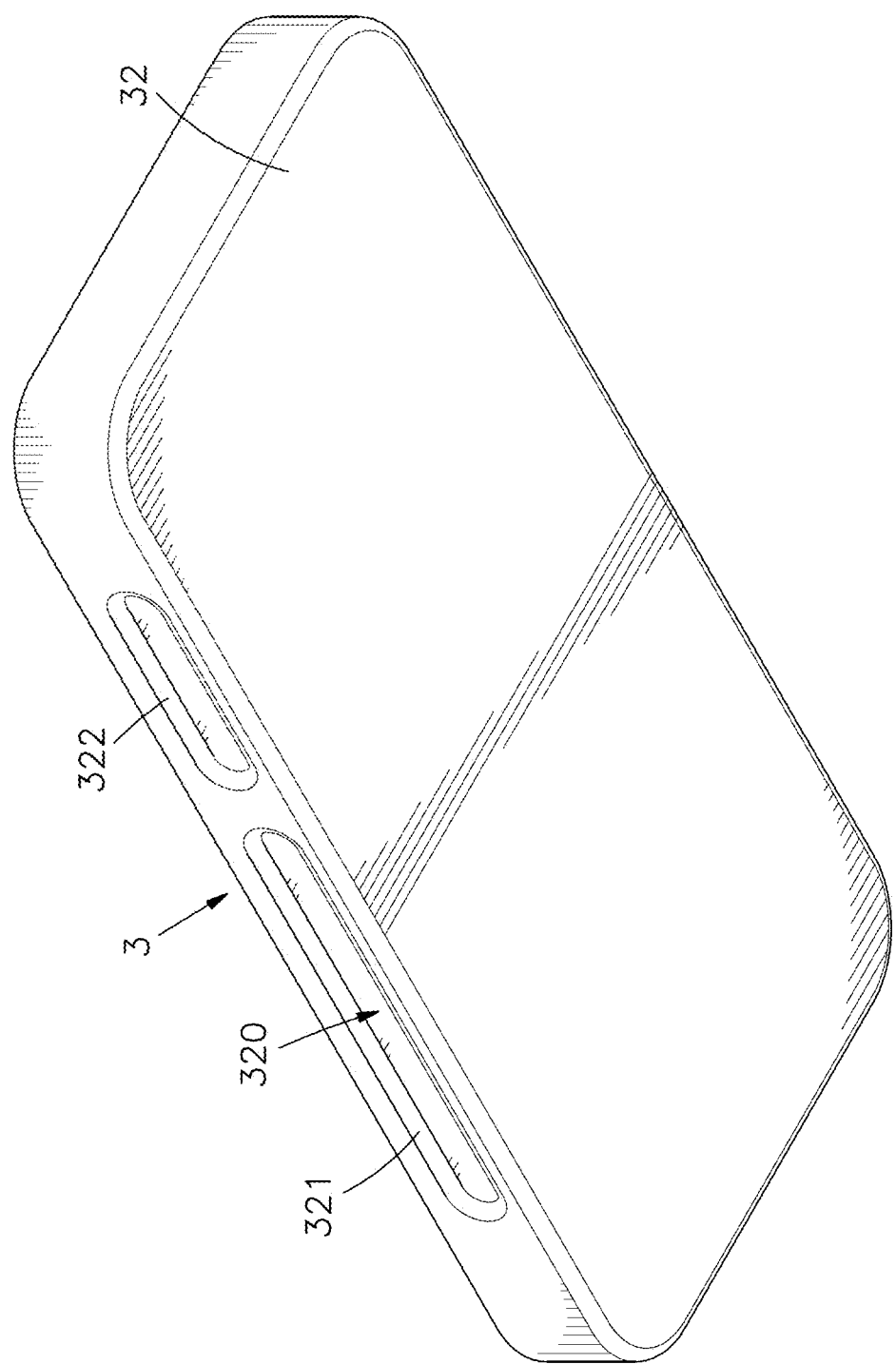
FIG. 7 is an oblique bottom elevational view of the elastic housing of the control device of the combination knitted hat and earphone assembly in accordance with the present invention.
Figure 8:
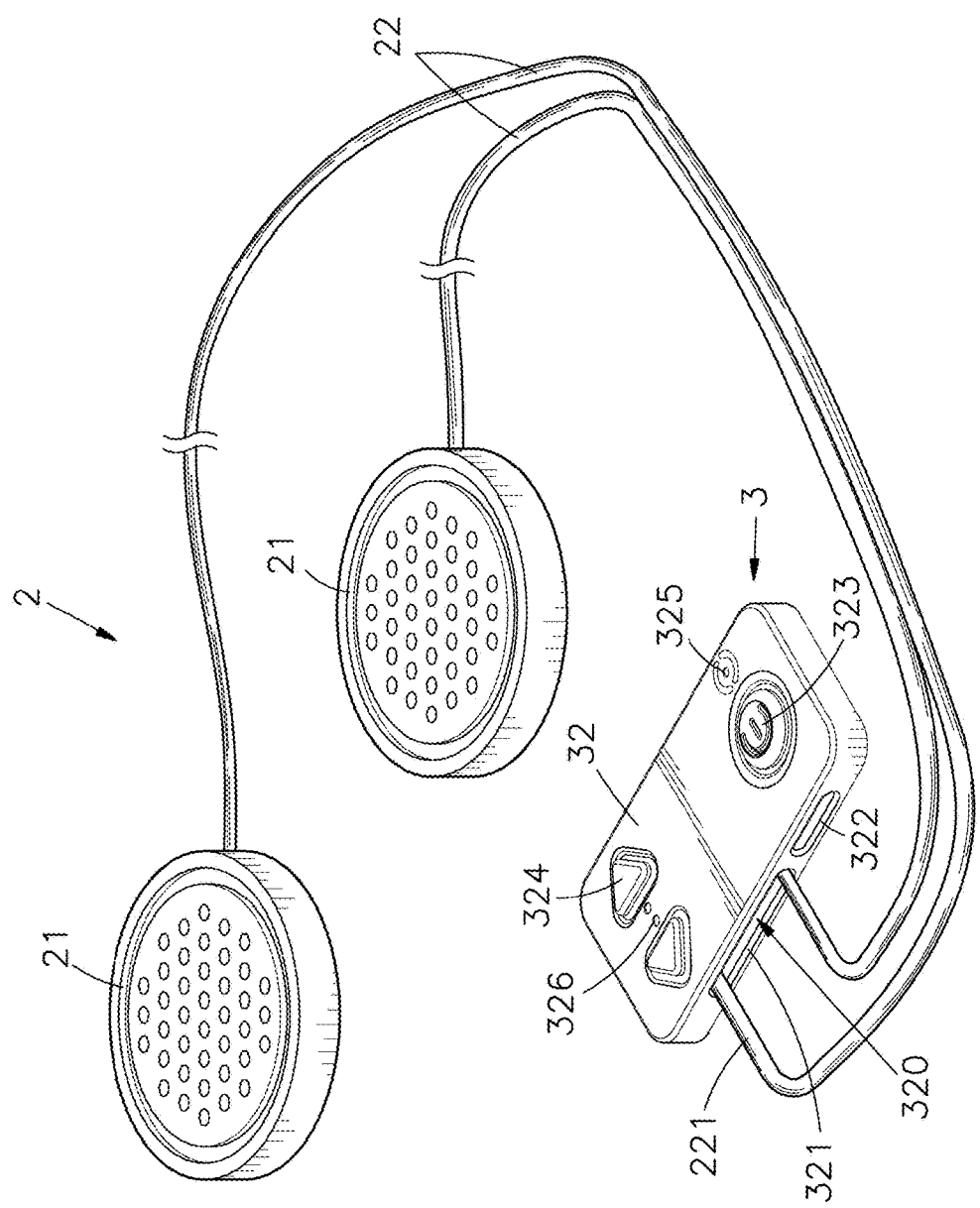
FIG. 8 is a schematic elevational view illustrating the arrangement of the earphone set and the control device in accordance with the present invention.
Figure 9:
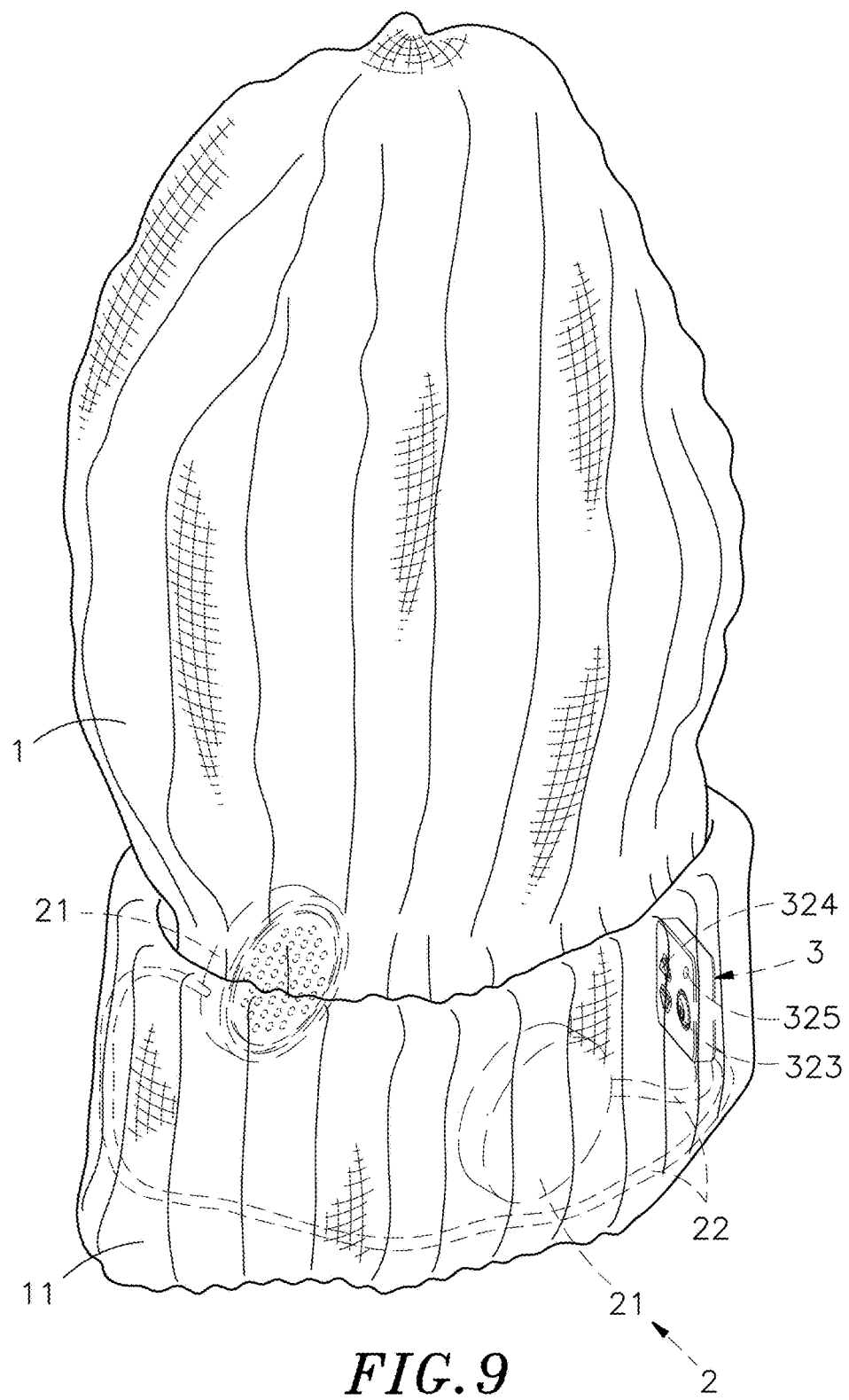
FIG. 9 is a schematic perspective view of the present invention, illustrating the earphone set and the control device installed in the knitted hat.
Figure 10:
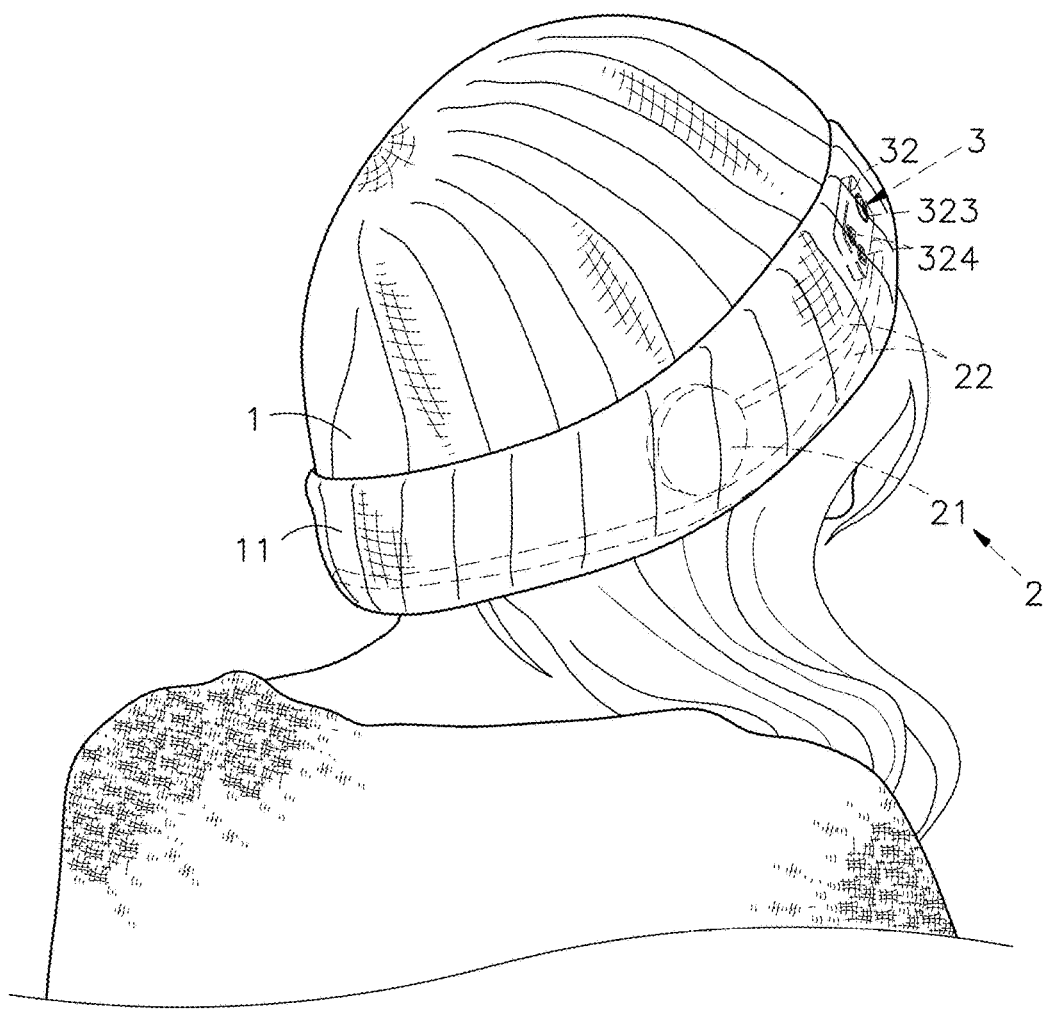
FIG. 10 is a schematic applied view of the present invention.

Referring to FIGS. 1-9, a combination knitted hat and earphone assembly in accordance with the present invention is shown comprising a knitted hat 1 and an earphone set 2.

The knitted hat 1 is elastically stretchable and deformable, defining therein a head-receiving space 10 for enabling the knitted hat to be capped on a user's head. Further, the knitted hat 1 comprises a double-knitted bucket portion 12 for covering over the user's head, and at least one single knitted brim portion 11 extended downwardly and outwardly from a bottom side of the bucket portion 12. The at least one brim portion 11 can be folded up into a multilayer brim around the bottom side of the bucket portion 12. Further, two storage pockets 121 of double-knitted fabric are bilaterally provided in the bucket portion 12. Each storage pocket 121 defines a storage chamber 1210 therein, and an opening 1211 at an inner side thereof in communication with the storage chamber 1210 and the head-receiving space 10. Further, a binding cover 122 is connected to one storage pocket 121 or between the two storage pockets 121. The binding cover 122 has two opposite sides thereof opened.

The earphone set 2 comprises two earphone speakers 21 for converting an electronic signal into a sound wave for output into the ear canals of the user, and two transmission wires 22 respectively electrically connected to the two earphone speakers 21. Each transmission wire 22 has its one end fixedly and electrically connected to one respective earphone speaker 21, and its other end terminating in an electrical signal input end 221.

In installation, respectively insert the two earphone speakers 21 of the earphone set 2 through the openings 1211 of the two storage pockets 121 inside the bucket portion 12 of the knitted hat 1 into the respective storage chambers 1210, keeping the transmission wires 22 of the earphone speakers 21 suspended at an inner side of the at least one brim portion 11 of the knitted hat 1, thus, the knitted hat 1 and the earphone set 2 are assembled to constitute the combination knitted hat and earphone assembly of the present invention.

In application, the user can folded up the at least one brim portion 11 of the knitted hat 1 to adjust the overall height of the knitted hat 1. As described above, the bucket portion 12 of the knitted hat 1 is a double-knitted fabric integrally connected with the topmost brim portion 11, carrying the two storage pockets 121 bilaterally on the inner side thereof. Thus, the user can insert the two earphone speakers 21 of the earphone set 2 through the openings 1211 of the respective storage pockets 121 into the respective storage chambers 1210, allowing the transmission wires 22 to be extended from the respective earphone speakers 21 through the respective openings 1211 to the outside of the respective storage pockets 121. Thereafter, the user can connect the electrical signal input ends 221 of the transmission wires 22 to a control device 3, and then put the control device 3 inside the binding cover 122. The control device 3 can be controlled to generate music and to transmit generated music signals through the two transmission wires 22 to the earphone speakers 21 for output. Further, the two transmission wires 22 of the earphone set 2 are received at an inner side relative to the folded at least one brim portion 11 of the knitted hat 1, i.e., the transmission wires 22 are not suspended outside the knitted hat 1, and thus, the transmission wires 22 will neither be accidentally pulled up by an external object nor hinder user actions.

The control device 3 comprises a circuit board assembly 31, and an elastic housing 32 houses the circuit board assembly 31. The circuit board assembly 31 comprises a wireless module 311 located at a bottom wall thereof far from the knitted hat 1, a rechargeable battery 312 located at the center of an opposing top wall thereof adjacent to the knitted hat 1, a battery charger connector 313 and a power switch 314 disposed near one lateral side of the rechargeable battery 312, two volume control switches 315 disposed near an opposite lateral side of the rechargeable battery 312, a microphone 316 located in one corner thereof adjacent to the power switch 314, a locating slot 317 cut through the opposing top and bottom walls of the circuit board assembly 31 and disposed at a lower side relative to the wireless module 311 and the rechargeable battery 312 for the passing of the transmission wires 22 for enabling the transmission wires 22 to be electrically connected to the circuit board assembly 31, a plurality of turning holes 318 cut through the opposing top and bottom walls of the circuit board assembly 31 and symmetrically disposed at two opposite lateral sides relative to the locating slot 317 for the passing of the two transmission wires 22, and at least one indicator light 319 disposed between the two volume control switches 315. The wireless module 311 can be a Bluetooth module or Wi-Fi module. In this embodiment, the wireless module 311 is a Bluetooth module.

Further, after mounting the circuit board assembly 31 in an elastic housing 32, the control device 3 is put in the binding cover 122 inside the knitted hat 1 and then the binding cover 122 is tied up. The elastic housing 32 is made by a soft flexible material, such as silicon rubber or soft rubber. The elastic housing 32 defines an accommodation space 320 for accommodating the circuit board assembly 31, a through hole 321 cut through a lower peripheral wall thereof in communication with the accommodation space 320 for the passing of the transmission wires 22, a plug hole 322 cut through the lower peripheral wall at one lateral side relative to the through hole 321 for allowing a part of the battery charger connector 313 to expose to the outside of the binding cover 122, a power switch operating button 323 and two volume control operating portions 324 located on a top wall thereof to face toward the at least one brim portion 11 and respectively exposed to the outside of the binding cover 122 and respectively disposed corresponding to the power switch 314 and the volume control switches 315, a sound-receiving hole 325 disposed in one corner thereof adjacent to the power switch operating button 323 and aimed at the microphone 316, at least one light hole 326 disposed between the two volume control operating portions 324 and respectively aimed at the at least one indicator lights 319, and a retaining portion 327 disposed between the power switch operating button 323 and the volume control operating portions 324 for securing the binding cover 122.

Figure 11:
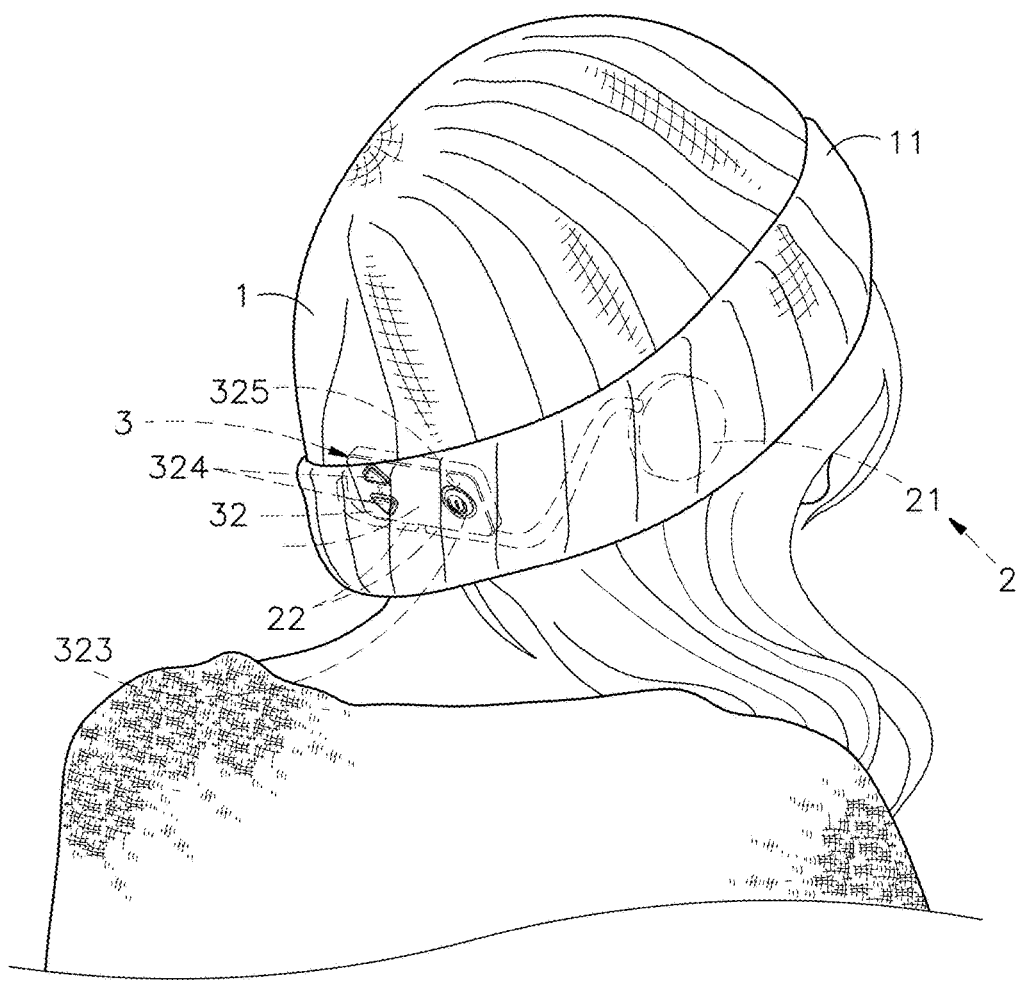
FIG. 11 is another schematic applied view of the present invention.

Referring to FIGS. 10 and 11 and FIGS. 1-3 and 10 again, when using the combination knitted hat and earphone assembly, put the head-receiving space 10 of the knitted hat 1 onto the user's head to respectively aim the two earphone speakers 21 of the earphone set 2 at the ears of the user. Subject to the elastic binding force of the double-knitted bucket portion 12 of the knitted hat 1, the two earphone speakers 21 in the storage pockets 121 are kept in close contact with the ears of the user, keeping the control device 3 at a top wall relative to the ears of the user. At this time, the user can link the Bluetooth module 311 of the control device 3 to a mobile electronic device (such as mini radio, notebook computer, tablet computer, smart phone, etc.) being carried by the user in a wireless manner. Alternatively, the user can connect the control device 3 to the mobile electronic device carried by the user using a cable. Thereafter, the user can operate the mobile electronic device to play music or audio files, enabling produced audio signals to be transmitted to the control device 3 in the knitted hat 1 for output through the two earphone speakers 21 of the earphone set 2 toward the user's ear canals. Thus, it is very convenient to use and to operate the combination knitted hat and earphone assembly. Further, because the transmission wires 22 are kept inside the knitted hat 1, the transmission wires 22 will not be stretched accidentally by an external force and will not hinder the user's actions.

The Bluetooth, Wi-Fi or any other wireless protocol applied for wireless signal transmission from the mobile electronic device and the control device 3 in the knitted hat 1 and the related transcoding, decoding, data file conversion and digital audio conversion techniques are of the known art and not within the scope of the spirit of the present invention, no further detailed description in this regard will be necessary.

Because the hard and protruded electronic component parts at the top side of the circuit board assembly 31 of the control device 3 are protected under the elastic housing 32 that is soft and flexible, the elastic housing 32 isolates the circuit board assembly 31 of the control device 3, the circuit board assembly 31 of the control device 3 is kept apart from the user's head by the elastic housing 32 and the knitted hat 1, preventing direct contact between the hard and protruded electronic component parts at the top side of the circuit board assembly 31 and the skin of the user's head, enhancing wearing comfort.

Further, the user can open the brim portion 11 at least one of the knitted hat 1, and then insert a mating connector at one end of a charging cable of a battery charger (not shown) through the plug hole 322 of the elastic housing 32 into connection with the battery charger connector 313 of the control device 3 for charging the rechargeable battery 312 with an external power source. Further, during application, the user can press the volume control operating portion 324 of the elastic housing 32 to drive the respective volume control switches 315 of the control device 3 in regulating the volume of the output sound. Further, when the mobile phone, tablet computer or other mobile electronic device been carried by the user and linked to the control device 3 receives a phone call, the user can press the power switch operating button 323 of the elastic housing 32 to switch on the power switch 314 of the control device 3 to interrupt the music and to pick up the phone call, and thus, the user can hear the voice from the earphone speakers 21 and the user's voice can be picked up by the microphone 316 of the control device 3 through the sound-receiving hole 325 in the elastic housing 32, establishing a two-way dialogue and achieving the purpose of ease of use. The user can press the power switch operating button 323 of the elastic housing 32 again to switch off the power switch 314 of the control device 3.

Further, each of the at least one indicator light 319 of the control device 3 is controllable to give off a particular color of light or to flash, rendering a visual indicator signal through one respective light hole 326 of the elastic housing 32 and spaces in the knitted hat 1 so that the user can know the operating status of the control device 3, such as power-up, power capacity of the rechargeable battery 312, Bluetooth search, connection of mobile electronic device, etc. If the elastic housing 32 is opaque, the at least one light hole 326 is requisite for the passing of the light emitted by the at least one indicator light 319. If the elastic housing 32 is transparent or translucent, the at least one light hole 326 can be eliminated, enabling the light emitted by the at least one indicator light 319 to go directly through the elastic housing 32 to the outside.

Further, if the knitted hat 1 is contaminated or gets dirty after a long use, the user can extend out the at least one brim portion 11 and pull the two earphone speakers 21 of the earphone set 2 out of the storage chambers 1210 of the respective storage pockets 121 through the respective openings 1211, and then take the control device 3 out of the binding cover 122, allowing the knitted hat 1 to be washed and cleaned. Thus, the combination knitted hat and earphone assembly facilitates mounting the earphone set 2 in the knitted hat 1 and dismounting the earphone set 2 from the knitted hat 1.

When dismounting the earphone set 2 from the control device 3, the transmission wires 22 of the earphone set 2 can be accidentally stretched. According to the present invention, the electrical signal input ends 221 of the transmission wires 22 of the earphone set 2 are respectively downwardly inserted through respective outer turning holes 318 at two opposite lateral side relative to the locating slot 317 of the circuit board assembly 31 of the control device 3 to the bottom wall of the circuit board assembly 31, and then respectively upwardly inserted through respective adjacent inner turning holes 318 to the top wall of the circuit board assembly 31, and then downwardly inserted through the locating slot 317 to the bottom wall of the circuit board assembly 31, and then electrically bonded to respective contacts near the center of the bottom wall of the circuit board assembly 31. Because the transmission wires 22 are extended upwardly and downwardly through the locating slot 317 and the turning holes 318 and closely attached to the opposing top and bottom walls of the circuit board assembly 31, if the transmission wires 22 are stretched accidentally by an external force, the stretching force can simply increase the tension of the transmission wires 22 and will not be concentrated at the bonding points between the electrical signal input ends 221 and the circuit board assembly 31. Even after repeated mounting and dismounting operations, the bonding points between the electrical signal input ends 221 of the transmission wires 22 of the earphone set 2 and the circuit board assembly 31 can still be maintained intact, preventing the electrical signal input ends 221 from peeling off and avoiding poor contact between the electrical signal input ends 221 and the circuit board assembly 31, and thus, the invention achieves high level of signal transmission stability and prolongs the lifespan of the earphone set 2.

In the embodiment that the binding cover 122 of the knitted hat 1 is disposed between the two storage pockets 121, the control device 3 is disposed at the bottom wall relative to the user's head. Further, the microphone 316 of the circuit board assembly 31 of the control device 3 is disposed near to the power switch 314; the sound-receiving hole 325 of the elastic housing 32 is disposed opposite to the knitted hat 1 and near the power switch operating button 323 and also aimed at the microphone 316. However, other equivalent modifications can be adopted without departing from the spirit and scope of the invention.

Figure 12:
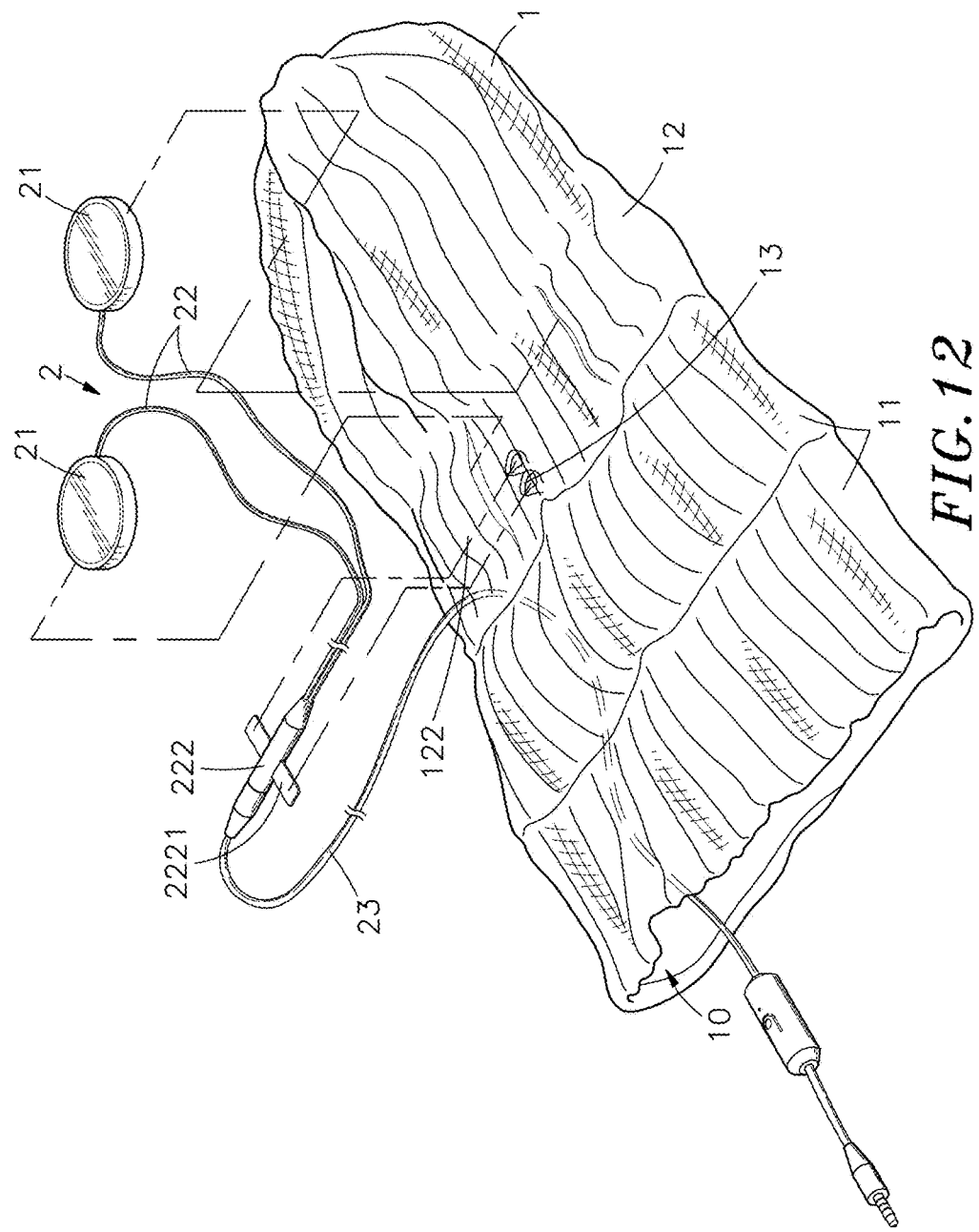
FIG. 12 is an exploded view of an alternate form of the combination knitted hat and earphone assembly in accordance with the present invention.
Figure 13:
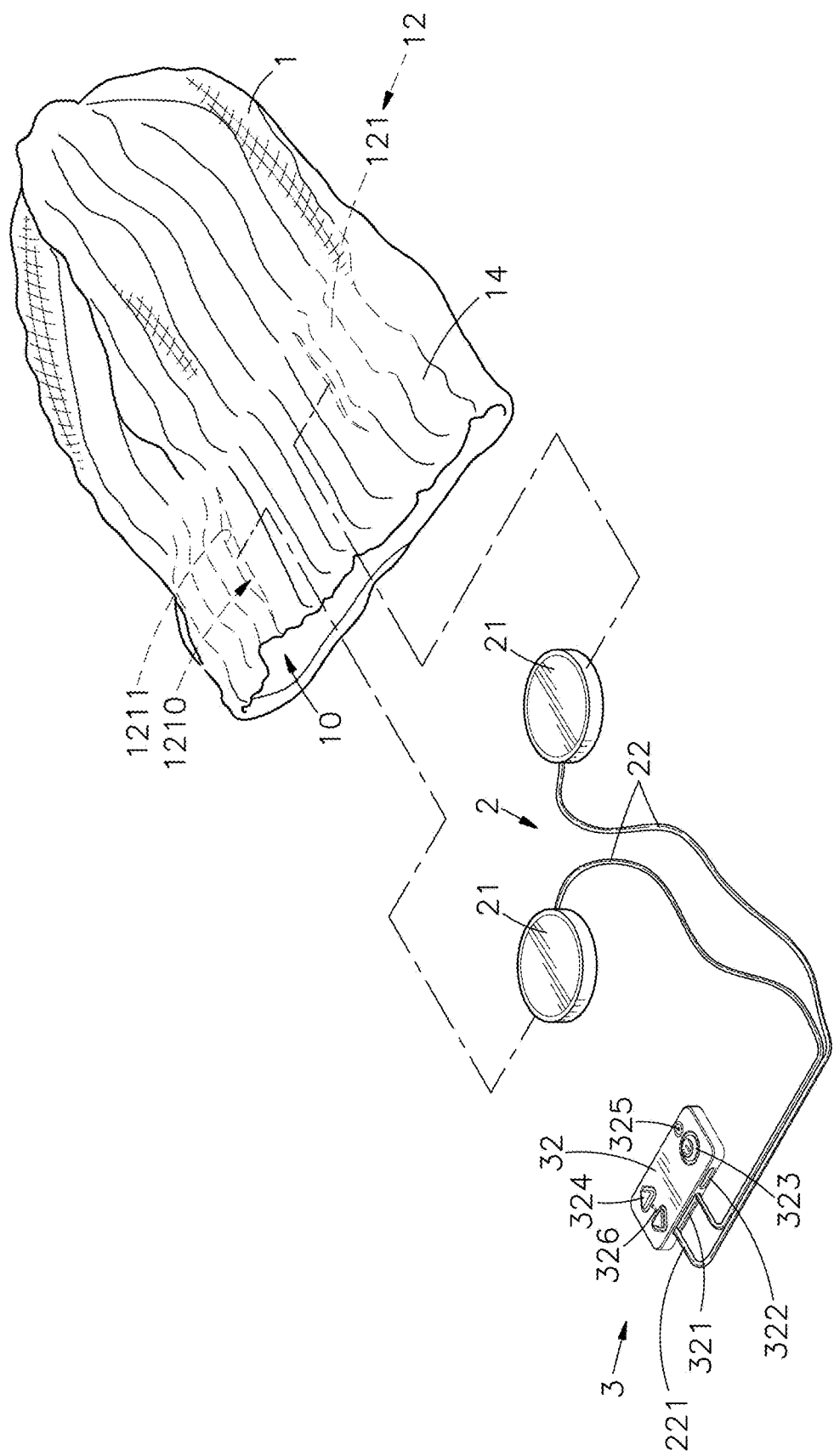
FIG. 13 is an exploded view of another alternate form of the combination knitted hat and earphone assembly in accordance with the present invention.
Figure 14:
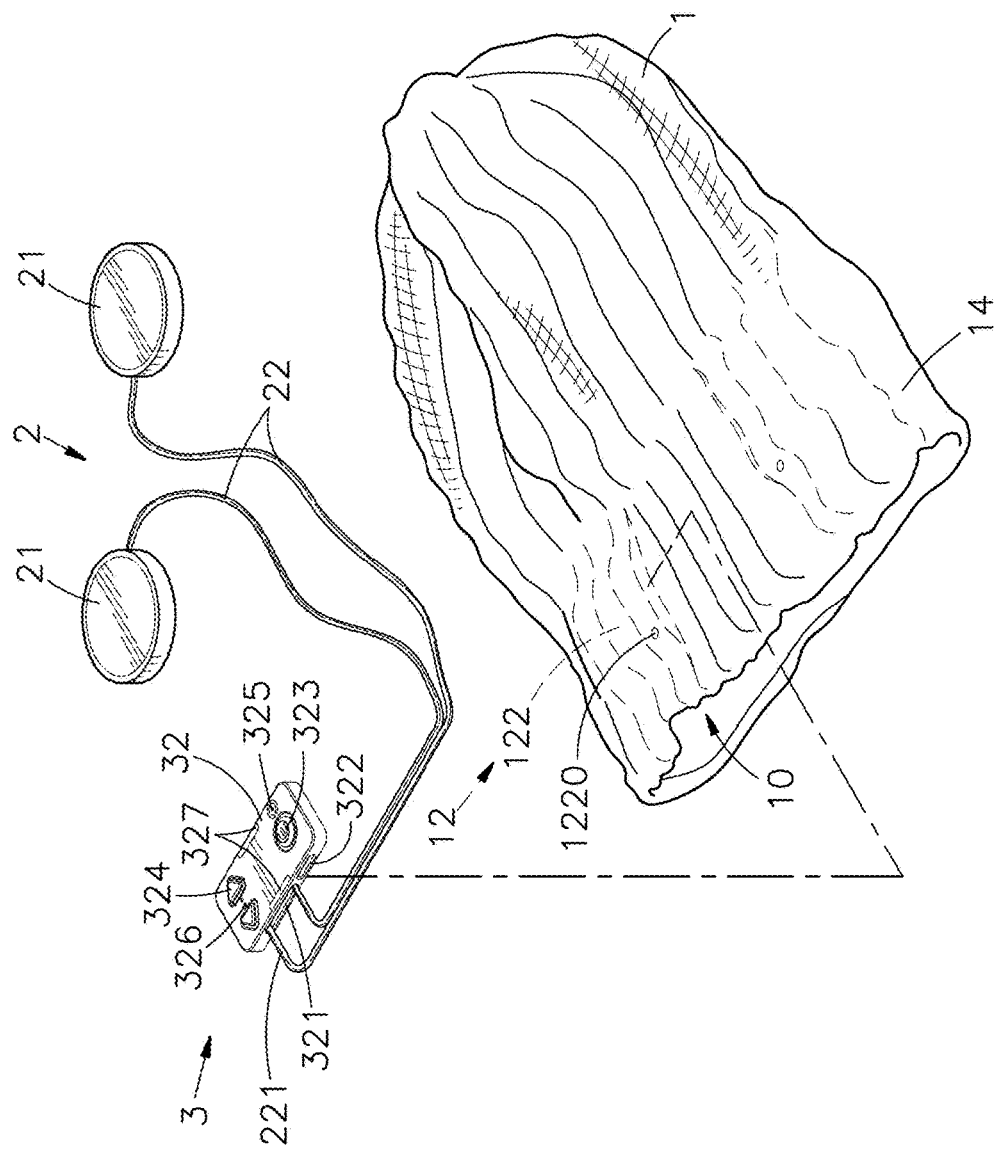
FIG. 14 is another exploded view of the combination knitted hat and earphone assembly of FIG. 13 when viewed from another angle.
Figure 15:
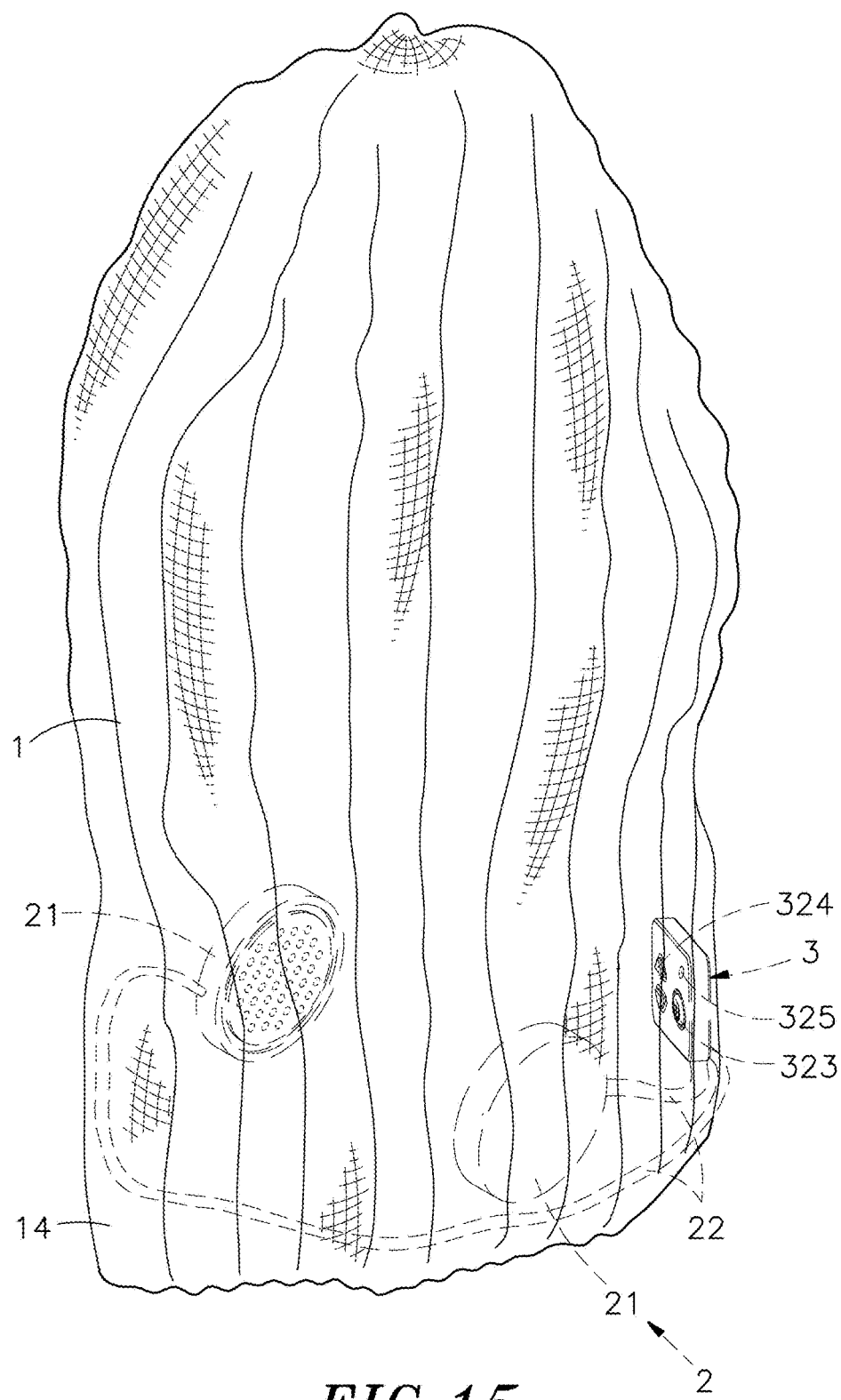
FIG. 15 is schematic drawing illustrating the outer appearance of the assembly of the combination knitted hat and earphone assembly shown in FIG. 13 and FIG. 14.
Figure 16:
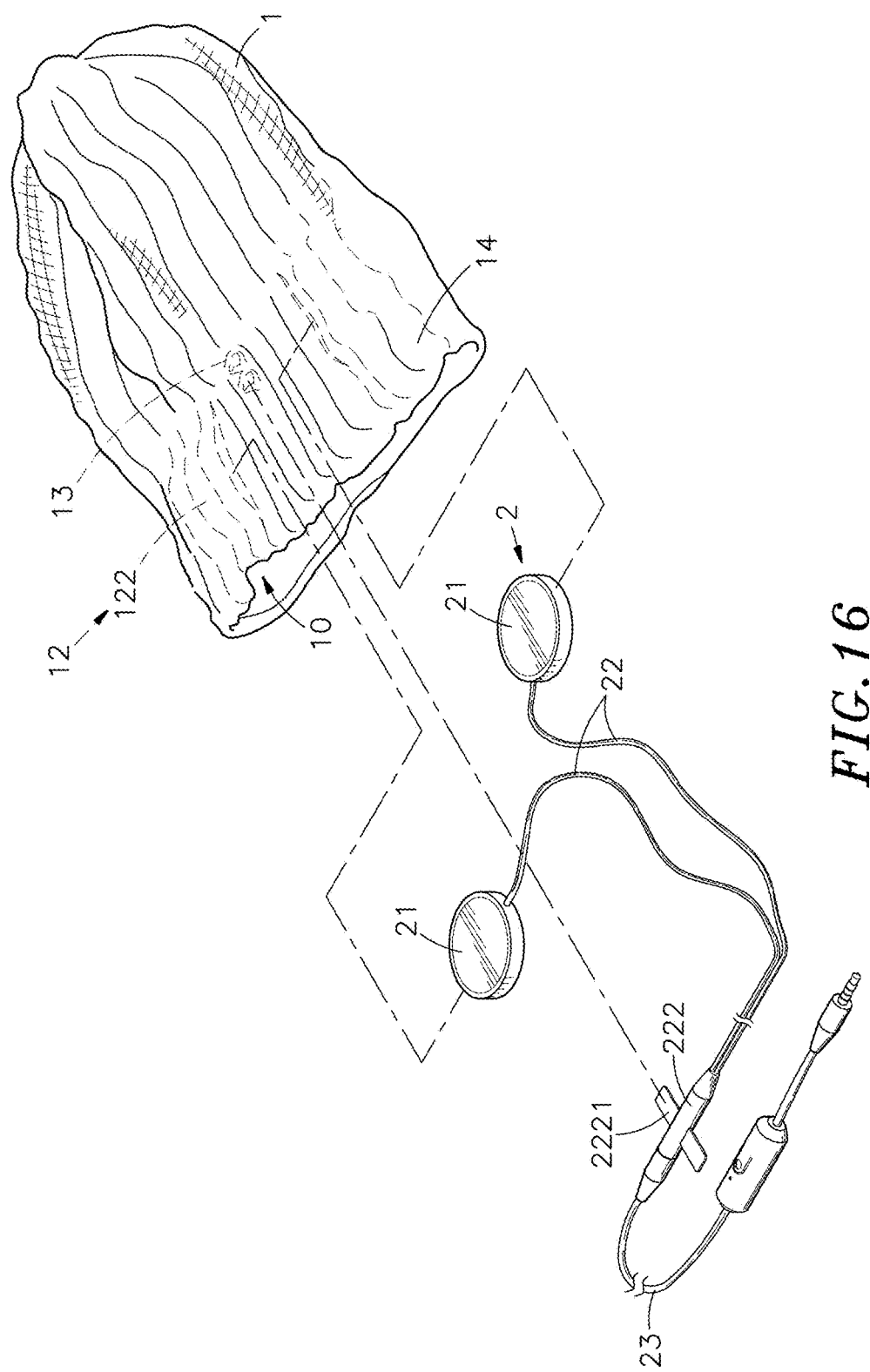
FIG. 16 is an exploded view of still another alternate form of the combination knitted hat and earphone assembly in accordance with the present invention.
Figure 17:
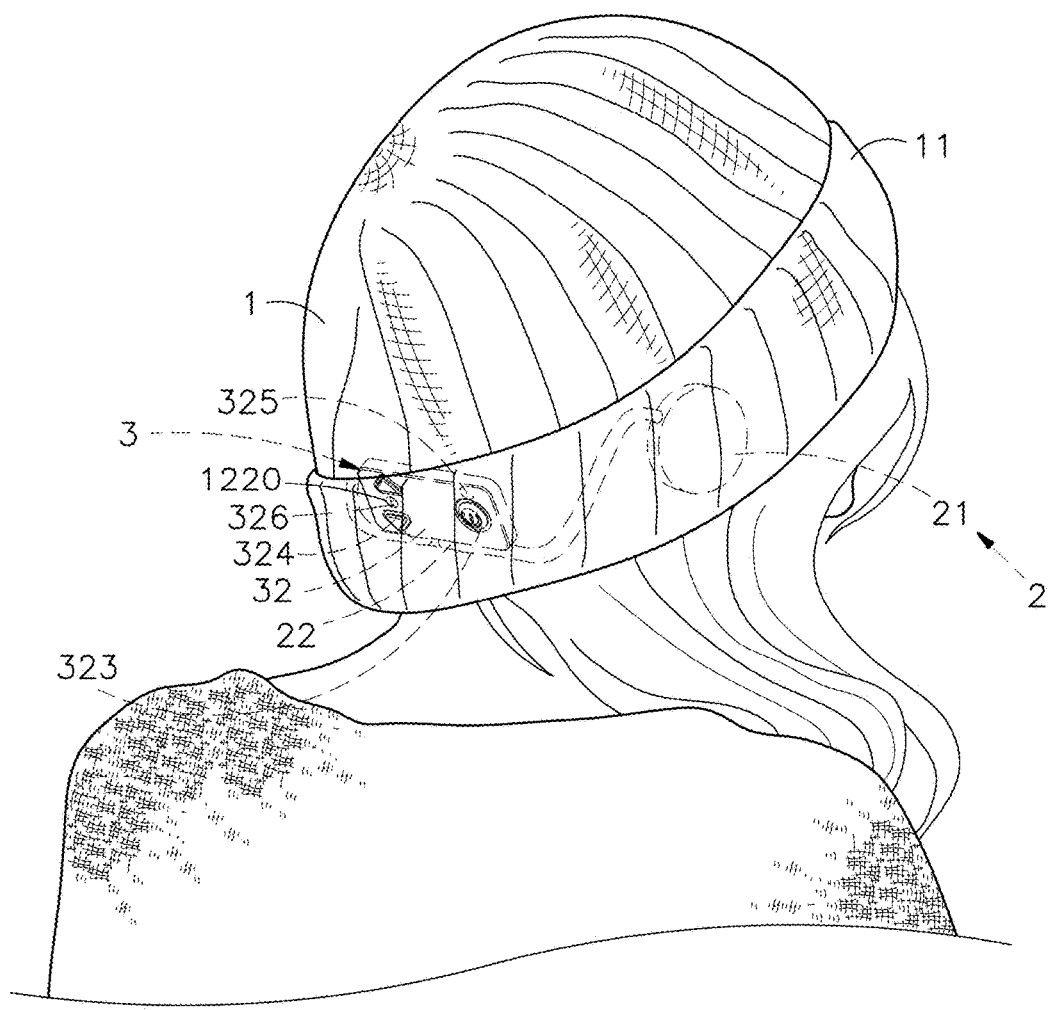
FIG. 17 is a schematic applied view, illustrating the combination knitted hat and earphone assembly of FIG. 16 put on the head of a user.

Referring to FIG. 12 and FIGS. 1, 2, 3 and 9 again, in an alternate form of the present invention, the earphone speakers 21 of the earphone set 2 are respectively inserted through the openings 1211 of the storage pockets 121 at the bucket portion 12 of the knitted hat 1 into the storage chambers 1210 in the respective storage pockets 121 to keep the transmission wires 22 of the earphone set 2 held in the folded at least one brim portion 11 of the knitted hat 1 with the electrical signal input ends 221 of the two transmission wires 22 electrically connected to an audio connector 222. The audio connector 222 comprises two wing plates 2221 symmetrically located at two opposite lateral sides and respectively secured to a respective elastic band 13 at the bucket portion 12 of the knitted hat 1 near one storage pocket 121 (or between the two storage pockets 121). Further, the audio connector 222 is electrically connected with a signal line 23 that is electrically connectable to an audio jack of an external mobile electronic device (such as mini radio, notebook computer, tablet computer, smart phone, or mobile phone). Thus, the user can operate the mobile electronic device to play music, enabling outputted audio signal to be transmitted through the signal line 23, the audio connector 222 and the transmission wires 22 to the two earphone speakers 21 of the earphone set 2. As the wing plates 2221 of the audio connector 222 are secured to the elastic bands 13 at the bucket portion 12 of the knitted hat 1, the audio connector 222 and the transmission wires 22 are constantly kept in knitted hat 1 even if the signal line 23 is accidentally stretched by an external force, preventing displacement of the transmission wires 22 and the earphone speakers 21 relative to the knitted hat 1.

Referring to FIGS. 13, 14, 15, 16 and 17, other alternate forms of the combination knitted hat and earphone assembly are shown. As illustrated, the combination knitted hat and earphone assembly comprises a knitted hat 1 and an earphone set 2.

The knitted hat 1 is elastically stretchable and deformable, defining therein a head-receiving space 10 for enabling the knitted hat 1 to be capped on a user's head. Further, the knitted hat 1 comprises a double-knitted bucket portion 12 for covering over the user's head, and a brim portion 14 extended downwardly and outwardly from a bottom side of the bucket portion 12. The brim portion 14 can be folded up into a multilayer brim around the bottom side of the bucket portion 12. Further, two storage pockets 121 of double-knitted fabric are bilaterally provided in the bucket portion 12. Each storage pocket 121 defines a storage chamber 1210 therein, and an opening 1211 at an inner side thereof in communication with the storage chamber 1210 and the head-receiving space 10. Further, a binding cover 122 is connected to one storage pocket 121 or between the two storage pockets 121. The binding cover 122 has two opposite sides thereof opened. Thus, the user can insert two earphone speakers 21 of the earphone set 2 through the openings 1211 of the two storage pockets 121 inside the bucket portion 12 of the knitted hat 1 into the respective storage chambers 1210, keeping respective transmission wires 22 of the earphone speakers 21 suspended at an inner side of the brim portion 11 of the knitted hat 1. At this time, the user can connect respective electrical signal input ends 221 of the transmission wires 22 of the earphone speakers 21 to a control device 3, enabling the control device 3 to be received inside the binding cover 122 at one lateral side of one storage pocket 121 or between the two storage pockets 121. Thus, the music generated by the control device 3 can be transmitted through the two transmission wires 22 to the earphone speakers 21 for output. Further, the transmission wires 22 of the earphone speakers 21 are received in the folded brim portion 14 around the lower part of the bucket portion 12 and kept from sight and prohibited from being stretched accidentally.

Further, a through hole 1220 is cut through an upper part of the brim portion 14 and the lower part of the bucket portion 12 in communication with the space inside the binding cover 122 and the space outside the knitted hat 1 so that the user can conveniently insert the control device 3 from the outside of the knitted hat 1 through the through hole 1220 into the inside of binding cover 122. Further, the control device 3 comprises at least one light hole 326 that faces toward the through hole 1220 when the control device 3 is put in the inside of binding cover 122 so that the light emitted by indicator lights 319 of the control device 3 can go through the at least one light hole 326 and the through hole 1220 to the outside of the knitted hat 1, and the user can see the operating status of the control device 3 that is received in the inside of binding cover 122, facilitating the use.

Further, the electrical signal input ends 221 of the two transmission wires 22 of earphone set 2 can be electrically connected to an audio connector 222. The audio connector 222 comprises two wing plates 2221 symmetrically located at two opposite lateral sides and respectively secured to a respective elastic band 13 at the bucket portion 12 of the knitted hat 1 near one storage pocket 121 (or between the two storage pockets 121), and is electrically connected with a signal line 23 that is electrically connectable to an audio jack of an external mobile electronic device (such as mini radio, notebook computer, tablet computer, smart phone, or mobile phone). Thus, the user can operate the mobile electronic device to play music, enabling outputted audio signal to be transmitted through the signal line 23, the audio connector 222 and the transmission wires 22 to the two earphone speakers 21 of the earphone set 2 for output.

The user can then operate the mobile electronic device to play music or audio files, enabling produced audio signals to be transmitted through the signal line 23, the audio connector 222 and the transmission wires 22 to the two earphone speakers 21 of the earphone set 2 for output into the user's ear canals. Thus, it is very convenient to use and to operate the combination knitted hat and earphone assembly. Further, the wing plates 2221 of the audio connector 222 are secured to the elastic bands 13 at the bucket portion 12 of the knitted hat 1, the audio connector 222 and the transmission wires 22 are constantly kept in the knitted hat 1 even if the signal line 23 is accidentally stretched by an external force, preventing displacement of the transmission wires 22 and the earphone speakers 21 relative to the knitted hat 1.

In conclusion, the invention provides a combination knitted hat and earphone assembly, which comprises a knitted hat and an earphone set, wherein the knitted hat comprises a bucket portion of double-knitted fabric defining therein a head-receiving space for putting onto the user's head, at least one brim portion extended from the bucket portion around the head-receiving space of the knitted hat, and two storage pockets located at the bucket portion and respectively defined therein a storage chamber and an opening; the earphone set comprises two earphone speakers respectively inserted through the openings of the storage pockets into the respective storage chambers, and two transmission wires extended from the earphone speakers and terminating in a respective electrical signal input end for connection to a control device or mobile electronic device. As the transmission wires are kept in the knitted hat, they will not be accidentally stretched by an external object.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A combination of a knitted hat and earphone assembly, comprising:

said knitted hat comprising a bucket portion defining therein a head-receiving space for enabling said knitted hat configure to be positioned on the user's head, at least one brim portion extending from said bucket portion and two storage pockets bilaterally located at said bucket portion adjacent to said at least one brim portion, each said storage pocket defining a storage chamber and an opening in communication between said storage chamber and a space outside the respective said storage pocket;

an earphone set mountable in said bucket portion of said knitted hat, said earphone set comprising two earphone speakers respectively inserted into said storage chambers of said storage pockets, and two transmission wires, each wire having one end thereof respectively electrically connected to one respective said earphone speaker and an opposite end thereof respectively terminating in a respective electrical signal input end; and a control device, wherein said electrical signal input end of said transmission wires of said earphone set are electrically connected to said control device; said knitted hat further comprises a binding cover located at said bucket portion near said storage pockets and adapted for accommodating said control device in said knitted hat;

wherein said control device comprises a circuit board assembly and an elastic housing covering said circuit board assembly, said circuit board assembly comprises a wireless module located at a bottom wall of said knitted hat, a rechargeable battery located at the center of an opposing top wall of said circuit board assembly adjacent to said knitted hat, a battery charger connector and a power switch disposed on one lateral side of said rechargeable battery, two volume control switches disposed on an opposite lateral side of said rechargeable battery; said elastic housing comprises an accommodation space for accommodating said circuit board assembly, a through hole cut through a lower peripheral wall of said elastic housing in communication with said accommodation space for the passing of said transmission wires, a plug hole cut through said lower peripheral wall of said elastic housing at one lateral side relative to said through hole for allowing a part of said battery charger connector to expose to an outside of said binding cover, a power switch operating button and two volume control operating portions located on a top wall of said elastic housing to face toward said at least one brim portion of said knitted hat and respectively exposed to the outside of said binding cover and respectively disposed corresponding to said power switch and said volume control switches.

2. The combination of the knitted hat and earphone assembly as claimed in claim 1, wherein said bucket portion is forming of double layers of knotted material integrally formed with said at least one brim portion.

3. The combination of the knitted hat and earphone assembly as claimed in claim 1, wherein said circuit board assembly of said control device further comprises a microphone located in one corner of an opposing top of said circuit board assembly adjacent to said power switch, a locating slot cut through the opposing top and bottom walls of said circuit board assembly and disposed at a lower side relative to said wireless module and said rechargeable battery for the passing of said transmission wires for enabling said transmission wires to be electrically connected to said circuit board assembly, and a plurality of turning holes cut through the opposing top and bottom walls of said circuit board assembly and symmetrically disposed at two opposite lateral sides relative to said locating slot for the passing of said transmission wires; said elastic housing of said control device further comprises a sound-receiving hole disposed in one corner of said elastic housing adjacent to said power switch operating button and aimed at said microphone.

4. The combination of the knitted hat and earphone assembly as claimed in claim 3, wherein said circuit board assembly further comprises at least one indicator light disposed between said two volume control switches; said elastic housing comprises at least one light hole respectively aimed at said at least one indicator light.

5. The combination of the knitted hat and earphone assembly as claimed in claim 1, wherein said elastic housing of said control device further comprises a retaining portion disposed between said power switch operating button and said volume control operating portions for securing said binding cover.

6. The combination of the knitted hat and earphone assembly as claimed in claim 1, wherein said binding cover is located at said bucket portion of said knitted hat at an outer lateral side of one of said storage pocket.

7. The combination of the knitted hat and earphone assembly as claimed in claim 1, wherein said binding cover is located at said bucket portion of said knitted hat between said two storage pockets.

8. The combination of the knitted hat and earphone assembly as claimed in claim 1, wherein said earphone set further comprises an audio connector electrically connected with said electrical signal input end of said transmission wire, said audio connector comprising a signal line electrically connectable to an audio jack of a mini radio, notebook computer, tablet computer, smart phone, or any other mobile electronic device.

9. A combination of a knitted hat and earphone assembly, comprising:
said knitted hat comprising a bucket portion being formed of double layers of knitted material and defining therein a head-receiving space for enabling said knitted hat configure to be positioned on the user's head, a brim portion extending from said bucket portion and two storage pockets bilaterally located at an inner side of said bucket portion within said head-receiving space adjacent to said brim portion, each said storage pocket defining a storage chamber and an opening in communication between said storage chamber and said head-receiving space; and
an earphone set mountable in said bucket portion of said knitted hat, said earphone set comprising two earphone speakers respectively inserted into said storage chambers of said storage pockets, and two transmission wires, each wire having one end thereof respectively electrically connected to one respective said earphone speaker and an opposite end thereof respectively terminating in a respective electrical signal input end;
wherein said electrical signal input end of said transmission wires of said earphone set are respectively electrically connected to a control device; said knitted hat further comprises a binding cover fixedly connected to said bucket portion for securing said control device inside said bucket portion,
wherein said control device comprises a circuit board assembly and an elastic housing covering said circuit board assembly, said circuit board assembly comprising a wireless module located at a bottom wall of said knitted hat, a rechargeable battery located at the center of an opposing top wall of said circuit board assembly adjacent to said knitted hat, a battery charger connector and a power switch disposed on one lateral side of said rechargeable battery, two volume control switches disposed on an opposite lateral side of said rechargeable battery; said elastic housing comprises an accommodation space for accommodating said circuit board assembly, a through hole cut through a lower peripheral wall of said elastic housing in communication with said accommodation space for the passing of said transmission wires, a plug hole cut through said lower peripheral wall of said elastic housing at one lateral side relative to said through hole for allowing a part of said battery charger connector to expose to an outside of said binding cover, a power switch operating button and two volume control operating portions located on a top wall of said elastic housing to face toward said brim portion of said knitted hat and respectively exposed to the outside of said binding cover and respectively disposed corresponding to said power switch and said volume control switches.

10. The combination of the knitted hat and earphone assembly as claimed in claim 9, wherein said brim portion of said knitted hat is integrally knitted with said bucket portion; said storage pockets are disposed inside said bucket portion with the opening of one said storage pocket facing toward the opening of the other said storage pocket.

11. The combination of the knitted hat and earphone assembly as claimed in claim 9, wherein said circuit board assembly of said control device further comprises a microphone located in one corner of an opposing top of said circuit board assembly adjacent to said power switch, a locating slot cut through the opposing top and bottom walls of said circuit board assembly and disposed at a lower side relative to said wireless module and said rechargeable battery for the passing of said transmission wires for enabling said transmission wires to be electrically connected to said circuit board assembly, and a plurality of turning holes cut through the opposing top and bottom walls of said circuit board assembly and symmetrically disposed at two opposite lateral sides relative to said locating slot for the passing of said transmission wires; said elastic housing of said control device further comprises a sound-receiving hole disposed in one corner of said elastic housing adjacent to said power switch operating button and aimed at said microphone.

12. The combination of the knitted hat and earphone assembly as claimed in claim 11, wherein said circuit board assembly further comprises at least one indicator light disposed between said two volume control switches; said elastic housing comprises at least one light hole respectively aimed at said at least one indicator light.

13. The combination of the knitted hat and earphone assembly as claimed in claim 9, wherein said elastic housing of said control device further comprises a retaining portion disposed between said power switch operating button and said volume control operating portions for securing said binding cover.

14. The combination of the knitted hat and earphone assembly as claimed in claim 9, wherein said binding cover is connected to an outer side of one said storage pocket inside said bucket portion of said knitted hat and adjacent to said brim portion.

15. The combination of the knitted hat and earphone assembly as claimed in claim 9, wherein said binding cover is disposed inside said bucket portion of said knitted hat between said two storage pockets and adjacent to said brim portion.

16. The combination of the knitted hat and earphone assembly as claimed in claim 9, wherein said earphone set further comprises an audio connector electrically connected with the said electrical signal input end of said two transmission wires and adapted for electrically connecting said earphone set to an external mobile electronic device of radio, notebook computer, tablet computer or smart phone.

* * * * *